(12) United States Patent
Kondo et al.

(10) Patent No.: US 12,129,544 B2
(45) Date of Patent: Oct. 29, 2024

(54) CLEANING METHOD AND PLASMA TREATMENT DEVICE

(71) Applicant: Tokyo Electron Limited, Tokyo (JP)

(72) Inventors: Yoshiyuki Kondo, Nirasaki (JP); Yutaka Fujino, Nirasaki (JP); Hiroyuki Ikuta, Nirasaki (JP); Hideki Yuasa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 18 days.

(21) Appl. No.: 17/916,159

(22) PCT Filed: Mar. 29, 2021

(86) PCT No.: PCT/JP2021/013307
§ 371 (c)(1),
(2) Date: Sep. 30, 2022

(87) PCT Pub. No.: WO2021/205928
PCT Pub. Date: Oct. 14, 2021

(65) Prior Publication Data
US 2023/0220545 A1    Jul. 13, 2023

(30) Foreign Application Priority Data

Apr. 7, 2020  (JP) .................................. 2020-069207

(51) Int. Cl.
*C23C 16/44*     (2006.01)
*H01J 37/32*     (2006.01)
*H01L 21/3065*   (2006.01)

(52) U.S. Cl.
CPC ...... *C23C 16/4405* (2013.01); *H01J 37/3244* (2013.01); *H01J 37/32862* (2013.01); *H01L 21/3065* (2013.01)

(58) Field of Classification Search
CPC ....................... C23C 16/4405; H01J 37/32862
See application file for complete search history.

(56) References Cited

U.S. PATENT DOCUMENTS

2016/0225585 A1* 8/2016 Wada ................ H01J 37/32834
2018/0374682 A1* 12/2018 Tanikawa .......... H01L 21/67253

FOREIGN PATENT DOCUMENTS

JP    2004-296512 A    10/2004
JP    2019-009403 A    1/2019

* cited by examiner

*Primary Examiner* — Natasha N Campbell
(74) *Attorney, Agent, or Firm* — Nath, Goldberg & Meyer; Jerald L. Meyer; Tanya E. Harkins

(57) ABSTRACT

The cleaning method according to an embodiment of the present invention is for cleaning a plasma processing apparatus that performs a plasma processing on a substrate. This cleaning method includes: forming a protective film; and cleaning. The forming the protective film involves forming the protective film in a plasma generation region by generating plasma while supplying a film-forming gas into a processing container in which a processing space including the plasma generation region and a diffusion region is formed. The cleaning involves cleaning an interior of the processing container in which the protective film has been formed by generating plasma while supplying a cleaning gas into the processing container.

10 Claims, 8 Drawing Sheets

CLEANING METHOD AND PLASMA TREATMENT DEVICE

This is a National Phase Application filed under 35 U.S.C. 371 as a national stage of PCT/JP2021/013307, filed Mar. 29, 2021, an application claiming the benefit of Japanese Patent Application No. 2020-069207, filed Apr. 7, 2020, the content of each of which is hereby incorporated by reference in its entirety.

TECHNICAL FIELD

The present disclosure relates to a cleaning method and a plasma processing apparatus.

BACKGROUND

In the related art, after plasma processing is performed on a substrate (hereinafter, also referred to as a "wafer"), an interior of a processing container in which the plasma processing has been performed is cleaned.

PRIOR ART DOCUMENTS

Patent Documents

Patent Document 1: Japanese laid-open publication No. 2004-296512

The present disclosure provides a technology of improving a cleaning uniformity within a processing container.

SUMMARY

A cleaning method according to an aspect of the present disclosure is a method of cleaning a plasma processing apparatus that performs a plasma processing on a substrate. The cleaning method includes: forming a protective film; and cleaning. In the forming the protective film, the protective film is formed in a plasma generation region by generating plasma while supplying a film-forming gas into a processing container in which a processing space including the plasma generation region and a diffusion region is formed. In the cleaning, an interior of the processing container in which the protective film has been formed by generating plasma is cleaned while supplying a cleaning gas into the processing container.

According to the present disclosure, it is possible to improve a cleaning uniformity within a processing container.

DETAILED DESCRIPTION

Hereinafter, embodiments of a cleaning method and a plasma processing apparatus disclosed herein will be described in detail with reference to the accompanying drawings. The cleaning method and the plasma processing apparatus disclosed according to the following embodiments are not limited.

<Plasma Processing Apparatus>

Figure 1:
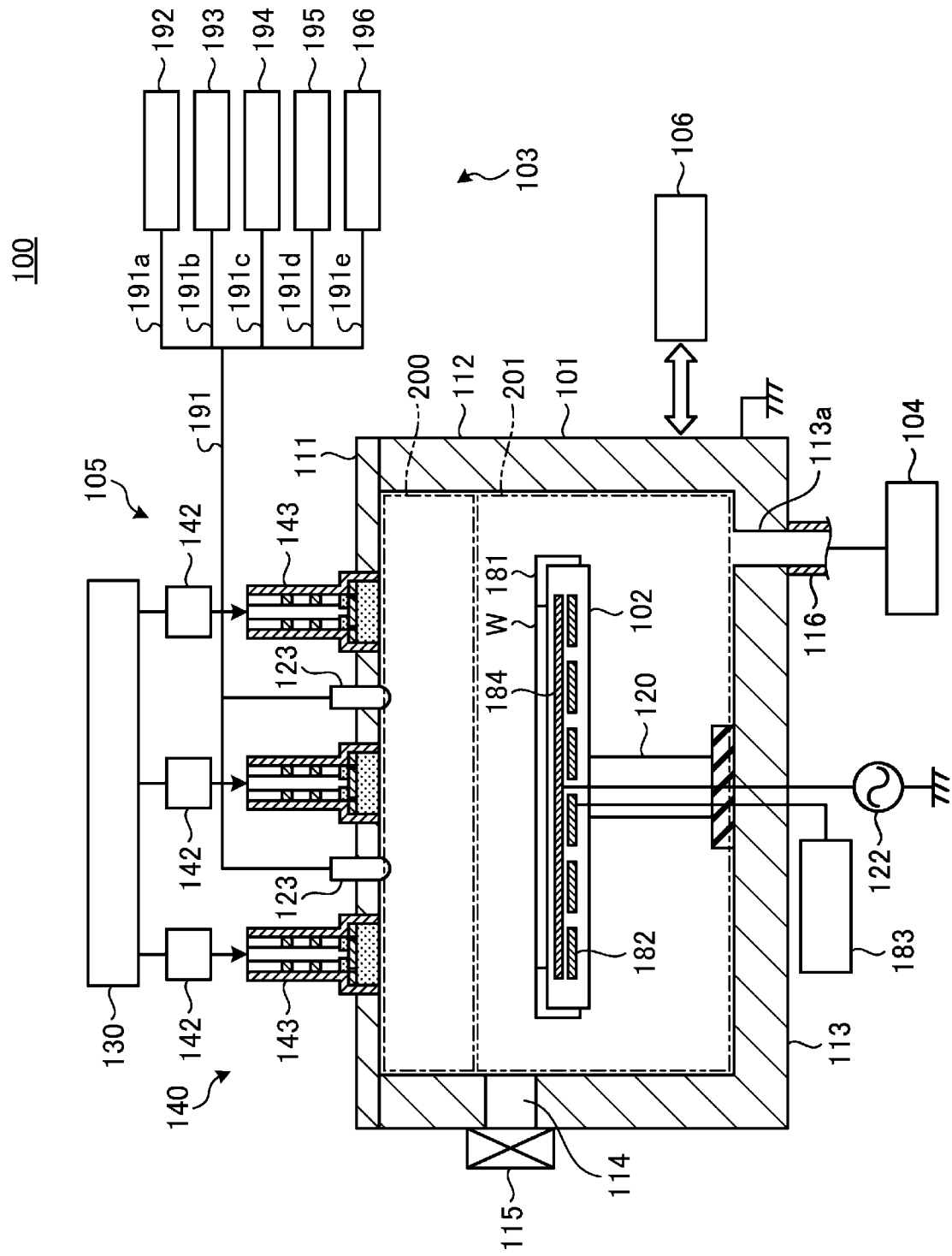
FIG. 1 is a view illustrating a schematic configuration of a plasma processing apparatus according to an embodiment.

A plasma processing apparatus 100 in which a cleaning method according to an embodiment is executed will be described with reference to FIG. 1. FIG. 1 is a view illustrating a schematic configuration of a plasma processing apparatus 100 according to an embodiment.

The plasma processing apparatus 100 performs a plasma processing on a wafer W by plasma chemical vapor deposition (CVD) using microwave plasma. Hereinbelow, an example of the plasma processing apparatus 100 that forms a SiN film on the wafer W will be described below, but the present disclosure is not limited thereto.

The plasma processing apparatus 100 includes a processing container 101, a stage 102, a gas supply mechanism 103, an exhaust apparatus 104, a microwave introduction apparatus 105, and a controller 106.

The processing container 101 accommodates a wafer W. The processing container 101 is made of metal material such as aluminum or an aluminum alloy. The processing container 101 is formed, for example, in a substantially cylindrical shape. The processing container 101 includes a ceiling wall 111, a side wall 112, and a bottom wall 113.

A plurality of holes are formed in the ceiling wall 111. A gas introduction nozzles 123 and a microwave radiation mechanism 143 of the microwave introduction apparatus 105 are fitted into the holes. That is, the ceiling wall 111 is provided with gas introduction nozzles 123 and microwave radiation mechanisms 143.

An exhaust hole 113*a* is formed in the bottom wall 113. An exhaust pipe 116 is connected to the exhaust hole 113*a*. The exhaust pipe 116 is connected to the exhaust apparatus 104.

The side wall 112 interconnects the ceiling wall 111 and the bottom wall 113. A carry-in/out port 114 is formed in the side wall 112. The carry-in/out port 114 is formed to enable carry-in/out of a wafer W to/from a transport chamber adjacent to the processing container 101. The carry-in/out port 114 is opened/closed by a gate valve 115.

The stage 102 is formed, for example, in a disc shape. The stage 102 is made of ceramics such as AlN. The stage 102 is supported by a support member 120. The support member 120 is made of ceramics such as AlN. The support member 120 is provided to extend upward from the vicinity of the center of the bottom wall 113 of the processing container 101.

A guide ring 181 that holds the wafer W is provided at the outer edge of the stage 102. The stage 102 is provided with lift pins which raise or lower the wafer W. A heater 182 is embedded in the stage 102. The heater 182 generates heat by being fed with power from a heater power supply 183, and heats the stage 102 and the wafer W. The heater 182 is, for example, a resistance heating-type heater. A thermocouple is inserted into the stage 102. The heating temperature of the wafer W is controlled by controlling the heat generation of the heater 182 based on a signal from the thermocouple.

An electrode 184 is embedded in the stage 102 above the heater 182. The electrode 184 has approximately the same size as the wafer W. A radio frequency bias power supply 122 is electrically connected to the electrode 184. A radio frequency bias for attracting ions is applied to the stage 102. The radio frequency bias power supply 122 may not be provided depending on plasma processing characteristics.

The gas supply mechanism 103 includes a plurality of gas introduction nozzles 123. Further, the gas supply mechanism 103 includes a silane ($SiH_4$) gas source 192, an ammonia ($NH_3$) gas source 193, an argon (Ar) gas source 194, a nitrogen trifluoride ($NF_3$) gas source 195, and a nitrogen ($N_2$) gas source 196.

The plurality of gas introduction nozzles 123 are fitted into the holes in the ceiling wall 111. The tips of the gas introduction nozzles 123 protrude into the processing container 101. The gas introduction nozzles 123 are supplied with gas from each of the gas sources 192 to 196 via a gas supply pipe 191 and introduce the supplied gas into the processing container 101.

The gas sources 192 to 196 are connected to the gas supply pipe 191 via branch pipes 191a to 191e, respectively. Each of the branch pipes 191a to 191e is provided with a mass flow controller and a valve. In the gas supply mechanism 103, by controlling each valve, the flow rate of the gas supplied from each of the gas sources 192 to 196 is controlled.

The $SiH_4$ gas source 192 supplies a $SiH_4$ gas, which is a film-forming gas. The film-forming gas may be a Si-containing gas such as a $Si_2H_6$ gas, tetra-silyl-amine (TSA) gas, in addition to the $SiH_4$ gas. The $NH_3$ gas source 193 supplies a $NH_3$ gas, which is a film-forming gas.

The Ar gas source 194 supplies an Ar gas, which is a plasma-generating gas. The plasma-generating gas is a rare gas, and may be a helium (He) gas, a neon (Ne) gas, or the like.

The $NF_3$ gas source 195 supplies a $NF_3$ gas, which is a cleaning gas. The $N_2$ gas source 196 supplies $N_2$ gas, which is a purge gas. The $N_2$ gas is supplied, for example, together with the plasma-generating gas. The plasma-generating gas may be supplied without supplying the $N_2$ gas as the purge gas. Each gas described above is an example, and the present disclosure is not limited thereto.

The exhaust apparatus 104 exhausts the gas within the processing container 101 via an exhaust pipe 116 by, for example, a vacuum pump. The exhaust apparatus 104 adjusts the pressure within the processing container 101 with a pressure control valve.

The microwave introduction apparatus 105 introduces electromagnetic waves (microwaves) into the processing container 101 to generate plasma. The microwave introduction apparatus 105 includes the ceiling wall 111 of the processing container 101, a microwave output part 130, and an antenna unit 140. The ceiling wall 111 functions as a ceiling plate.

Figure 2:
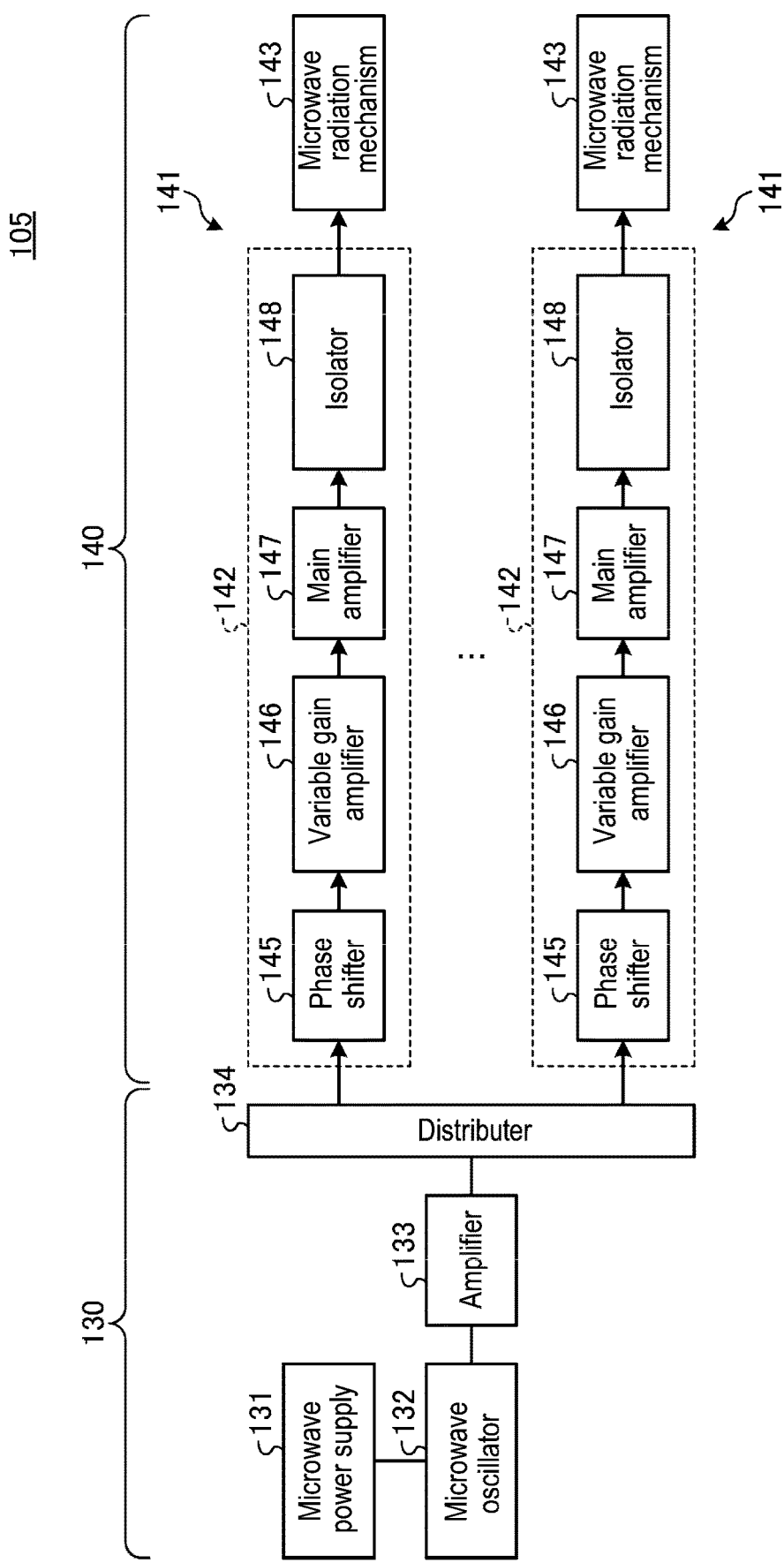
FIG. 2 is a block diagram illustrating an outline of a microwave output part according to an embodiment.

The microwave output part 130 generates microwaves, and distributes and outputs the microwaves to a plurality of paths. The microwave output part 130 includes a microwave power supply 131, a microwave oscillator 132, an amplifier 133, and a distributor 134, as illustrated in FIG. 2. FIG. 2 is a block diagram schematically illustrating the microwave output part 130 according to the embodiment.

The microwave oscillator 132 is a solid-state oscillator and oscillates microwaves at, for example, 860 MHz (e.g., PLL oscillation). The frequency of microwaves is not limited to 860 MHz, and a frequency in a range of 700 MHz to 10 GHz, such as 2.45 GHz, 8.35 GHz, 5.8 GHz, or 1.98 GHz, may be used.

The amplifier 133 amplifies the microwaves oscillated by the microwave oscillator 132. The distributor 134 distributes the microwaves amplified by the amplifier 133 to a plurality of paths. The distributor 134 distributes the microwaves while matching impedances on the input side and the output side.

The antenna unit 140 introduces the microwaves output from the microwave output part 130 into the processing container 101 (see FIG. 1). The antenna unit 140 includes a plurality of antenna modules 141. Each of the plurality of antenna modules 141 introduces microwaves distributed by the distributor 134 into the processing container 101. Each antenna module 141 includes an amplifier 142 and a microwave radiation mechanism 143.

The amplifier 142 amplifies and outputs the distributed microwaves. The amplifier 142 includes a phase shifter 145, a variable gain amplifier 146, a main amplifier 147, and an isolator 148.

The phase shifter 145 changes the phase of microwaves. The variable gain amplifier 146 adjusts a power level of the microwaves input to the main amplifier 147. The main amplifier 147 is configured as a solid-state amplifier. The isolator 148 separates reflected microwaves, which are reflected by the antenna 156 (see FIG. 3) of the microwave radiation mechanism 143 and travel toward the main amplifier 147.

Figure 3:
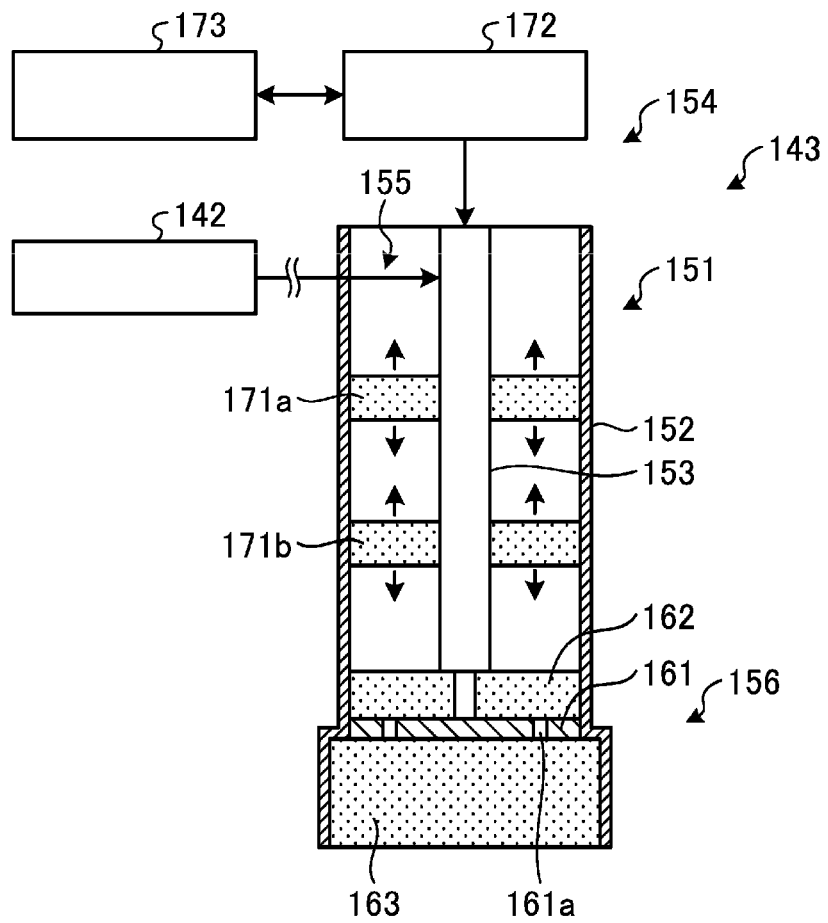
FIG. 3 is a view schematically illustrating an example of a microwave radiation mechanism according to an embodiment.

Here, the microwave radiation mechanism 143 will be described with reference to FIG. 3. FIG. 3 is a view schematically illustrating an example of the microwave radiation mechanism 143 according to an embodiment.

The microwave radiation mechanism 143 radiates the microwaves output from the amplifier 142 into the processing container 101 (see FIG. 1). The microwave radiation mechanism 143 includes an outer conductor 152 and inner conductor 153, which are formed in a cylindrical shape. The inner conductor 153 is provided within and coaxially with the outer conductor 152.

The microwave radiation mechanism 143 includes a coaxial tube 151 including a microwave transmission path, a tuner 154, a feeder 155, and an antenna 156 between the outer conductor 152 and the inner conductor 153. The tuner 154 matches an impedance of a load with a characteristic impedance of the microwave power supply 131.

The feeder 155 feeds the amplified microwaves from the amplifier 142 to the microwave transmission path. The microwaves amplified by the amplifier 142 are introduced from the side of the upper end portion of the outer conductor 152 into the feeder 155 via a coaxial cable, and the microwaves are radiated by, for example, a feeding antenna. By the radiation of microwaves, microwave power is fed to the microwave transmission path between the outer conductor 152 and the inner conductor 153, and propagates towards the antenna 156.

The antenna 156 is provided at the lower end of the coaxial tube 151. The antenna 156 radiates microwaves from the coaxial tube 151 into the processing container 101. The antenna 156 includes a planar antenna 161, a wave retardation material 162, and a microwave transmission plate 163.

The planar antenna 161 is disc-shaped. The planar antenna 161 is connected to the lower end of the inner conductor 153. A slot 161a is formed in the planar antenna 161. The slot 161a is formed to pass through the planar antenna 161. The shape of the slot 161a is appropriately set such that microwaves are efficiently radiated. A dielectric may be inserted into the slot 161a.

The wave retardation material 162 is disposed on a top surface side of the planar antenna 161. The wave retardation material 162 is made of material having a dielectric constant greater than that of vacuum. The wave retardation material 162 is capable of adjusting the phase of microwaves depending on a thickness of the retardation material 162 to maximize a radiant energy of the microwaves.

The microwave transmission plate 163 is disposed on a lower surface side of the planar antenna 161. The microwave transmission plate 163 is fitted into the ceiling wall 111. The lower surface of the microwave transmission plate 163 is exposed to the inner space of the processing container 101. The microwave transmission plate 163 is made of a dielectric and formed in such a shape that it may efficiently radiate microwaves in a TE mode. The microwaves having transmitted through the microwave transmission plate 163 generate plasma in the space within the processing container 101.

As material that forms the wave retardation material 162 and the microwave transmission plate 163, for example, quartz, ceramics, or a fluorine-based resin, such as a polytetrafluoroethylene resin or a polyimide resin, may be used.

The tuner 154 forms a slug tuner. The tuner 154 includes slugs 171a and 171b, an actuator 172, and a tuner controller 173. The slugs 171a and 171b are two slugs disposed at portions closer to the base end (upper end) than the antenna 156 of the coaxial tube 151. The slugs 171a and 171b have an annular plate shape, are made of dielectric material such as ceramics, and are disposed between the outer conductor 152 and the inner conductor 153 of the coaxial tube 151.

The actuator 172 independently drives each of the two slugs 171a and 171b. The actuator 172 individually drives the slugs 171a and 171b by, for example, rotating two screws with which the slugs 171a and 171b are screwed, respectively. The actuator 172 vertically moves the slugs 171a and 171b based on a command from the tuner controller 173.

The tuner controller 173 controls the actuator 172. The tuner controller 173 adjusts the positions of the slugs 171a and 171b such that the impedance at the terminal ends becomes, for example, 50Ω.

The main amplifier 147, the tuner 154, and the planar antenna 161 are arranged close to each other. The tuner 154 and the planar antenna 161 constitute a lumped constant circuit, and also function as a resonator. An impedance mismatch exists in a mounting portion of the planar antenna 161. However, since the tuner 154 directly tunes the plasma load, it is possible to tune the plasma load including plasma with high accuracy, and thus it is possible to eliminate an influence of reflection on the planar antenna 161.

Figure 4:
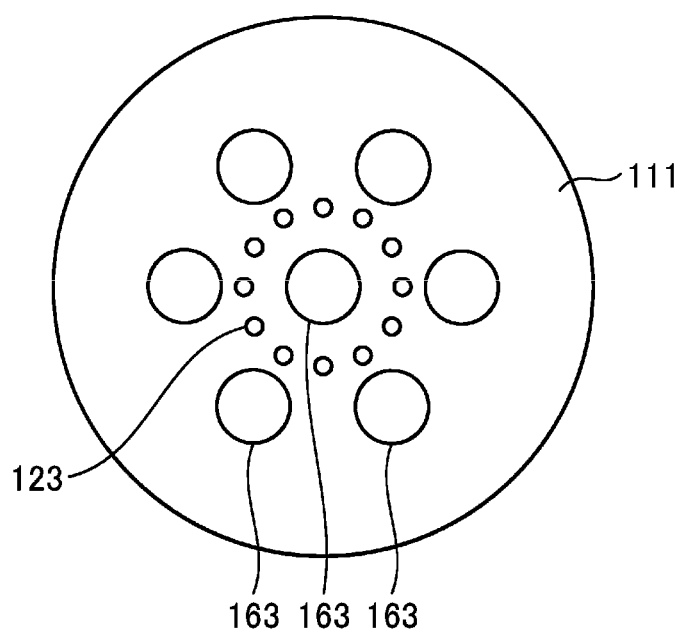
FIG. 4 is a view schematically illustrating an example of a ceiling wall of a processing container according to an embodiment.

For example, seven microwave radiation mechanisms 143 are provided. The microwave transmission plates 163 corresponding to the microwave radiation mechanisms 143 are evenly arranged in a hexagonal close-packed arrangement, as illustrated in FIG. 4. FIG. 4 is a view schematically illustrating an example of the ceiling wall 111 of the processing container 101 according to an embodiment.

One of the seven microwave transmission plates 163 is arranged in the center of the ceiling wall 111. The other six microwave transmission plates 163 are arranged around the central microwave transmission plate 163. The seven microwave transmission plates 163 are arranged such that the adjacent microwave transmission plates 163 are equidistantly spaced. In addition, the plurality of gas introduction nozzles 123 of the gas supply mechanism 103 are arranged so as to surround the periphery of the central microwave transmission plate 163. The number of microwave radiation mechanisms 143 is not limited to seven.

Returning back to FIG. 1, the controller 106 is typically constituted with a computer and controls each component of the plasma processing apparatus 100. The controller 106 includes a storage, which stores a process sequence and process recipes, which are control parameters, of the plasma processing apparatus 100, an input part, a display, and the like, and is capable of performing a predetermined control according to a selected process recipe.

In the plasma processing apparatus 100 described above, the Ar gas is supplied to the processing container 101 after the pressure within the processing container 101 is reduced. In addition, the microwaves distributed into a plurality of portions and output from the microwave output part 130 of the microwave introduction apparatus 105 are guided to the plurality of antenna modules 141 of the antenna unit 140, and radiated from the microwave radiation mechanisms 143. As a result, plasma is generated within the processing container 101.

Within the processing container 101 in which plasma has been generated, a plasma generation region 200 is formed in a region immediately below the ceiling wall 111, for example, a region several cm below the ceiling wall 111 (a region 1 cm to 3 cm below the lower surface of the ceiling wall 111). The plasma generation region 200 is a region in which plasma is generated by radiating microwaves to the Ar gas. In addition, a diffusion region 201 in which the plasma generated in the plasma generation region 200 diffuses is formed in a region located below the plasma generation region 200. The diffusion region 201 is, for example, a region including, for example, the stage 102 and a wafer W held on the stage 102. In the plasma processing apparatus 100, a processing space including the plasma generation region 200 and the diffusion region 201 is formed within the processing container 101.

An electron temperature of the plasma in the diffusion region 201 is lower than an electron temperature of the plasma in the plasma generation region 200. In addition, an electron density of the plasma in the diffusion region 201 is smaller than an electron density of the plasma in the plasma generation region 200.

<Film-Forming Process>

Figure 5:
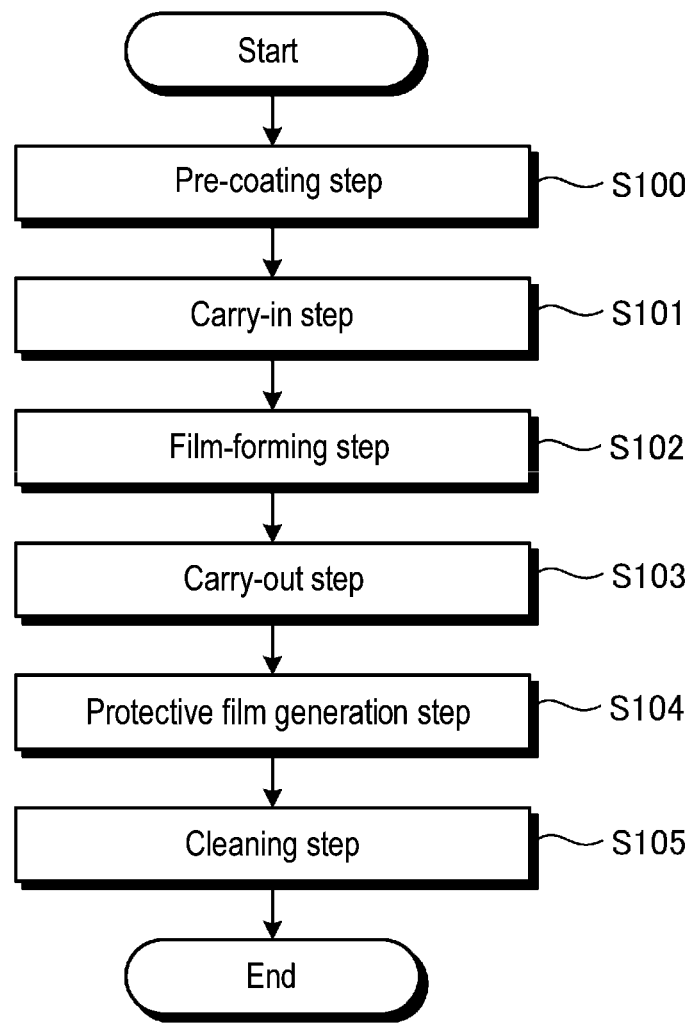
FIG. 5 is a flowchart illustrating an example of a film-forming process according to an embodiment.

Next, a film-forming process according to an embodiment will be described with reference to FIG. 5. FIG. 5 is a flowchart illustrating an example of a film-forming process according to an embodiment.

The controller 106 performs a pre-coating step (S100). The controller 106 performs the pre-coating step in a state that the wafer W is not carried into the processing container 101. The controller 106 reduces the pressure within the processing container 101 and supplies Ar gas into the processing container 101. Then, the controller 106 radiates microwaves from the microwave radiation mechanism 143 to generate plasma in the processing container 101. The controller 106 supplies the $SiH_4$ gas and the $NH_3$ gas at the timing at which plasma is generated. Thereby, the inner wall of the processing container 101 is coated with a SiN film. By performing the pre-coating step, particle sources present in the processing container 101 are covered with the SiN film.

The controller 106 performs a carry-in step (S101). The controller 106 carries the wafer W into the processing container 101 and places the wafer W on the stage 102.

The controller 106 performs a film-forming step (S102). The controller 106 forms a SiN film on the wafer W placed on the stage 102. The controller 106 performs plasma processing on the wafer W (an example of a substrate) within the processing container 101 to form the SiN film on the wafer W. Specifically, the controller 106 reduces the pressure within the processing container 101 to a first pressure. The first pressure is a preset pressure that is suitable for forming the SiN film on the wafer W.

Then, the controller 106 supplies the Ar gas into the processing container 101 and radiates microwaves from the microwave radiation mechanism 143 to generate plasma within the processing container 101. The controller 106 supplies the SiH$_4$ gas and the NH$_3$ gas at the timing at which plasma is generated. As a result, a SiN film is formed on the wafer W. The controller 106 controls each component of the plasma processing apparatus 100 such that the film-forming step is performed under the following processing conditions. The processing conditions below are examples, and are set depending on a type of film formation, a type of the plasma processing apparatus 100, and the like. For example, instead of the Ar gas, a He gas may be used as the plasma-generating gas. Alternatively, the film-forming step may be performed without supplying the N$_2$ gas. A deposit film containing a film-forming raw material is attached to the interior of the processing container 101 by the film-forming step.

(Processing Conditions for Film-Forming Step)
Microwave power of centrally-arranged microwave radiation mechanism 143: 0 to 500 W
Microwave power of peripherally-arranged microwave radiation mechanisms 143: 400 to 1,000 W
Pressure within processing container 101: 1 to 200 Pa
Temperature of wafer W: 300 to 600 degrees C.
Ar (He) gas: 0.1 to 1,000 sccm
N$_2$ gas: 0 to 50 sccm (at 0 sccm, N$_2$ gas is not used)
SiH$_4$ gas: 10 to 100 sccm
NH$_3$ gas: 10 to 300 sccm The controller 106 performs a carry-out step (S103). The controller 106 carries out the wafer W on which the SiN film has been formed from the processing container 101.

The controller 106 performs a protective film generation step (S104). The controller 106 performs the protective film generation step in the state in which the wafer W is carried out from the processing container 101. The controller 106 reduces the pressure within the processing container 101 to a second pressure. The second pressure is a preset pressure, and is a pressure for selectively forming a protective film in the plasma generation region 200. The second pressure is higher than the first pressure. When the pressure within the processing container 101 increases, the plasma generated in the plasma generation region 200 less likely to spread inside the processing container 101.

Then, the controller 106 supplies the Ar gas into the processing container 101 and radiates microwaves from the microwave radiation mechanism 143 to generate plasma within the processing container 101. The controller 106 supplies the SiH$_4$ gas and the NH$_3$ gas at the timing at which plasma is generated. As a result, a protective film is selectively formed in the plasma generation region 200 within the processing container 101. That is, in the protective film generation step, the protective film is selectively formed in the plasma generation region 200. By the protective film generation step, a protective film thicker than the diffusion region 201 is formed in the plasma generation region 200. The protective film is the same type of film as the SiN film formed on the wafer W. The controller 106 controls each component of the plasma processing apparatus 100 such that the protective film generation step is performed under the following processing conditions. The processing conditions for the protective film generation step are set depending on the processing conditions for the film-forming step. For example, instead of the Ar gas, the He gas may be used as a plasma-generating gas. Alternatively, the protective film generation step may be performed without supplying N$_2$ gas.

(Processing Conditions for Protective Film Generation Step)
Microwave power of centrally-arranged microwave radiation mechanism 143: 0 to 500 W
Microwave power of peripherally-arranged microwave radiation mechanisms 143: 400 to 1,000 W
Pressure within processing container 101: 1 to 200 Pa
Temperature of wafer W: 300 to 600 degrees C.
Ar (He) gas: 0.1 to 1,000 sccm
N$_2$ gas: 0 to 50 sccm (at 0 sccm, N$_2$ gas is not used)
SiN$_4$: 30 to 200 sccm
NH$_3$: 0.1 to 300 sccm As described above, the controller 106 performs the protective film generation step. In the protective film generation step, the protective film is formed in the plasma generation region 200 by generating plasma within the processing container 101 in which the processing space including the plasma generation region 200 and the diffusion region 201 are formed while supplying the SiN$_4$ gas and the NH$_3$ gas (an example of the film-forming gas) into the processing container 101. In the protective film generation step, the protective film is formed after plasma processing is performed on the wafer W (an example of the substrate). The SiN$_4$ gas and the NH$_3$ gas (an example of film-forming gases) supplied in the protective film generation step are the same types of gases as the SiN$_4$ gas and the NH$_3$ gas (examples of the film-forming gas) used for plasma processing of the wafer W (an example of the substrate).

The controller 106 performs a cleaning step (S105). The controller 106 performs the cleaning step in a state that the protective film is formed in the plasma generation region 200. The controller 106 reduces the pressure within the processing container 101 and supplies the Ar gas and the NF$_3$ gas into the processing container 101. Then, the controller 106 radiates microwaves from the microwave radiation mechanism 143 to generate plasma in the processing container 101. As a result, the deposit film attached to the interior of the processing container 101 is removed. The controller 106 controls each component of the plasma processing apparatus 100 such that the cleaning step is performed under the following processing conditions. The processing conditions for the cleaning step are set depending on the processing conditions for the film-forming step and the processing conditions for the protective film generation step. For example, instead of the Ar gas, the He gas may be used as the plasma-generating gas.

(Processing Conditions for Cleaning Step)
Microwave power of centrally-arranged microwave radiation mechanism 143: 0 to 500 W
Microwave power of peripherally-arranged microwave radiation mechanisms 143: 400 to 1,000 W
Pressure within the processing container 101: 1 to 200 Pa
Temperature of wafer W: 300 to 600 degrees C.
Ar (He) gas: 0.1 to 1,000 sccm
N$_2$ gas: 0.1 to 50 sccm
NF$_3$ gas: 500 to 2,000 sccm As described above, the controller 106 performs the cleaning step of cleaning the interior of the processing container 101 in which the protective film has been formed by generating plasma while supplying the NF$_3$ gas (an example of a cleaning gas) into the processing container 101.

In the plasma processing apparatus 100, a deposit film attached to the interior of the processing container 101 is removed by performing the cleaning step. An electron density of the plasma in the plasma generation region 200 is higher than an electron density of the plasma in the diffusion region 201. Therefore, removal amount of the deposit film per unit time is larger in the plasma generation region 200 than the diffusion region 201.

In a plasma processing apparatus according to a comparative example in which no protective film is formed in a plasma generation region, by performing a cleaning step, the cleaning step is continued in the state in which material of the processing container is exposed after removal of a deposit film in the plasma generation region is completed. That is, in the plasma processing apparatus according to the comparative example, a cleaning rate, which is a state of cleaning with reference to the processing container in which no deposit film is formed, differs between the plasma generation region and the diffusion region. Therefore, in the plasma processing apparatus according to the comparative example, there is a possibility that over-cleaning in which the processing container forming the plasma generation region is excessively cleaned will occur. When the over-cleaning occurs, the exposed material of the processing container reacts with the gas, and, for example, particles may be generated. In the plasma processing apparatus according to the comparative example, there is a possibility that the processing container will be replaced more frequently and thus the costs will increase.

The cleaning method according to the embodiment is executed in the plasma processing apparatus 100 that performs plasma processing on the wafer W (an example of the substrate). The cleaning method according to the embodiment includes a protective film generation step and a cleaning step. In the protective film generation step, the protective film is formed in the plasma generation region 200 by generating plasma within the processing container 101 in which the processing space including the plasma generation region 200 and the diffusion region 201 is formed while supplying the $SiN_4$ gas and the $NH_3$ gas (an example of the film-forming gas) into the processing container 101. In the cleaning step, the interior of the processing container 101 in which the protective film has been formed is cleaned by generating plasma while supplying the $NF_3$ gas (an example of the cleaning gas) into the processing container 101.

This makes it possible for the plasma processing apparatus 100 to reduce a difference in the cleaning rate between the plasma generation region 200 and the diffusion region 201 to suppress over-cleaning of the processing container 101 in the plasma generation region 200. That is, the plasma processing apparatus 100 is capable of improving uniformity in cleaning of the processing container 101 in the plasma generation region 200 and the diffusion region 201. Therefore, the plasma processing apparatus 100 is capable of suppressing generation of particles due to, for example, the cleaning step. In addition, the plasma processing apparatus 100 is capable of reducing, for example, a frequency of replacement of the processing container 101, and thus reducing the cost.

In addition, in the protective film generation step, the protective film is formed after plasma processing is performed on the wafer W (an example of the substrate).

This makes it possible for the plasma processing apparatus 100 to prevent the film-forming step of the wafer W from being executed in the state that the protective film is formed, and thus to prevent the generation of particles due to the protective film.

In addition, in the protective film generation step, the protective film is selectively formed in the plasma generation region 200.

This makes it possible for the plasma processing apparatus 100 to form the protective film in the plasma generation region 200, and thus to improve uniformity in cleaning the processing container 101 in the plasma generation region 200 and the diffusion region 201.

In addition, the $SiH_4$ gas and the $NH_3$ gas (an example of the film-forming gas) supplied in the protective film generation step are the same types of gases as the $SiH_4$ gas and the $NH_3$ gas (examples of the film-forming gas) used for plasma processing of the wafer W (an example of the substrate).

This makes it possible for the plasma processing apparatus 100 to form the protective film without using a separate gas source configured to form the protective film. Therefore, the plasma processing apparatus 100 is capable of improving uniformity in cleaning the processing container 101 in the plasma generation region 200 and the diffusion region 201 while suppressing an increase in a size of the entire apparatus.

Next, a cleaning method of the plasma processing apparatus 100 according to a modification will be described.

Figure 6:
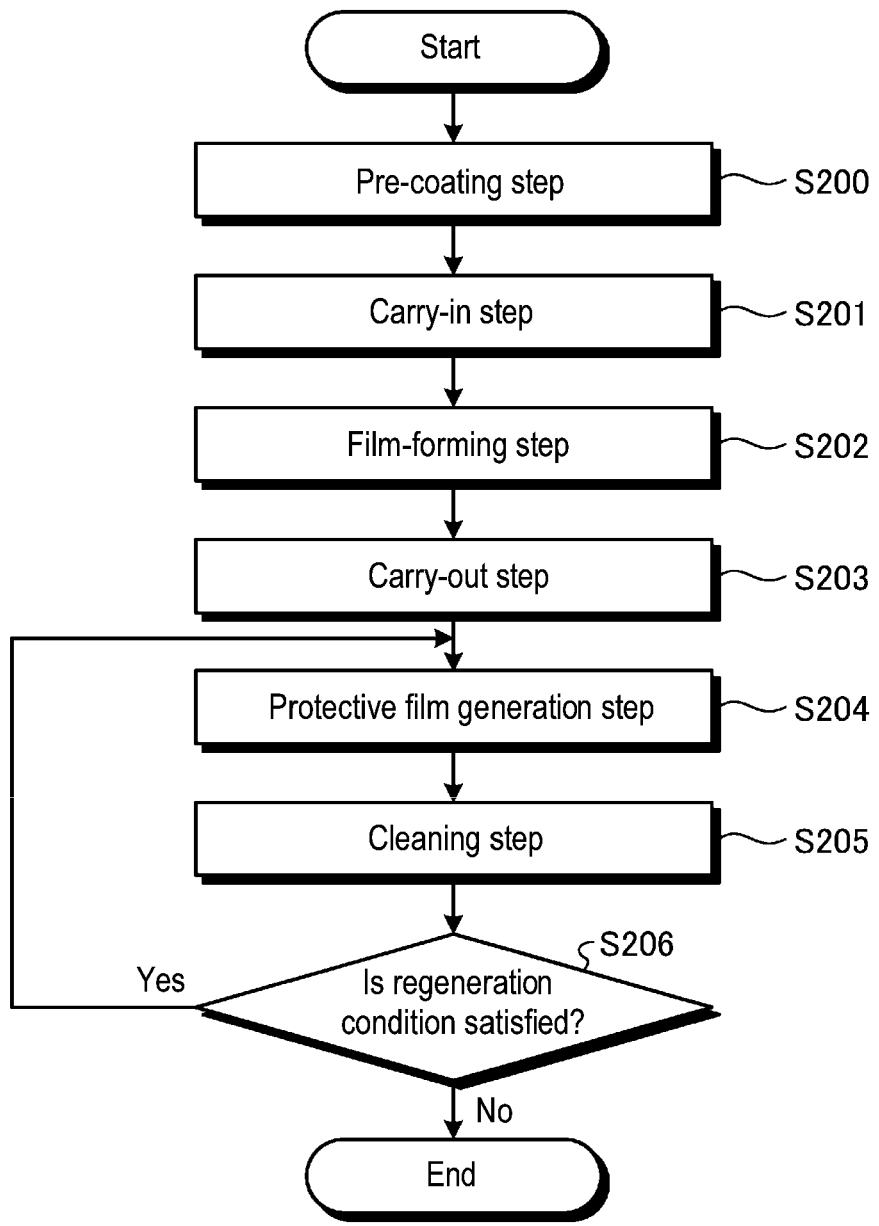
FIG. 6 is a flowchart illustrating an example of a film-forming process according to a modification.

In the cleaning method for the plasma processing apparatus 100 according to the modification, as illustrated in FIG. 6, a protective film generation step and a cleaning step may be repeatedly performed. FIG. 6 is a flowchart illustrating an example of a film-forming process according to the modification.

The plasma processing apparatus 100 according to the modification forms a film on a wafer W, like the plasma processing apparatus 100 according to the embodiment (S200 to S203). The plasma processing apparatus 100 according to the modification forms a protective film in the plasma generation region 200 by a protective film generation step and then performs cleaning by a cleaning step (S204 and S205). When a regeneration condition is satisfied (S206: "Yes"), the plasma processing apparatus 100 according to the modification performs the protective film generation step again and then performs the cleaning step (S204 and S205). When the regeneration condition is not satisfied (S206: "No"), the plasma processing apparatus 100 according to the modification determines that the cleaning is completed, and terminates the film formation process.

The regeneration condition is, for example, a condition related to the number of cleaning steps. The plasma processing apparatus 1 according to the modification determines that the regeneration condition is satisfied when the number of cleaning steps is less than a preset number. That is, the plasma processing apparatus 1 according to the modification determines that the cleaning is completed when the number of cleaning steps is equal to or greater than the preset number. The regeneration condition is changeable and is changed depending on a state of the processing container 101.

This makes it possible for the plasma processing apparatus 100 according to the modification to perform the cleaning while forming the protective film depending on the state of the processing container 101 in the plasma generation region 200 which has been cleaned. Therefore, the plasma processing apparatus 100 according to the modification is capable of improving uniformity in cleaning the processing container 101 in the plasma generation region 200 and the diffusion region 201.

In the cleaning method of the plasma processing apparatus 100 according to the modification, the protective film generation step and the cleaning step may be performed after the film-forming step is performed on a set plural number of wafers W.

Figure 7:
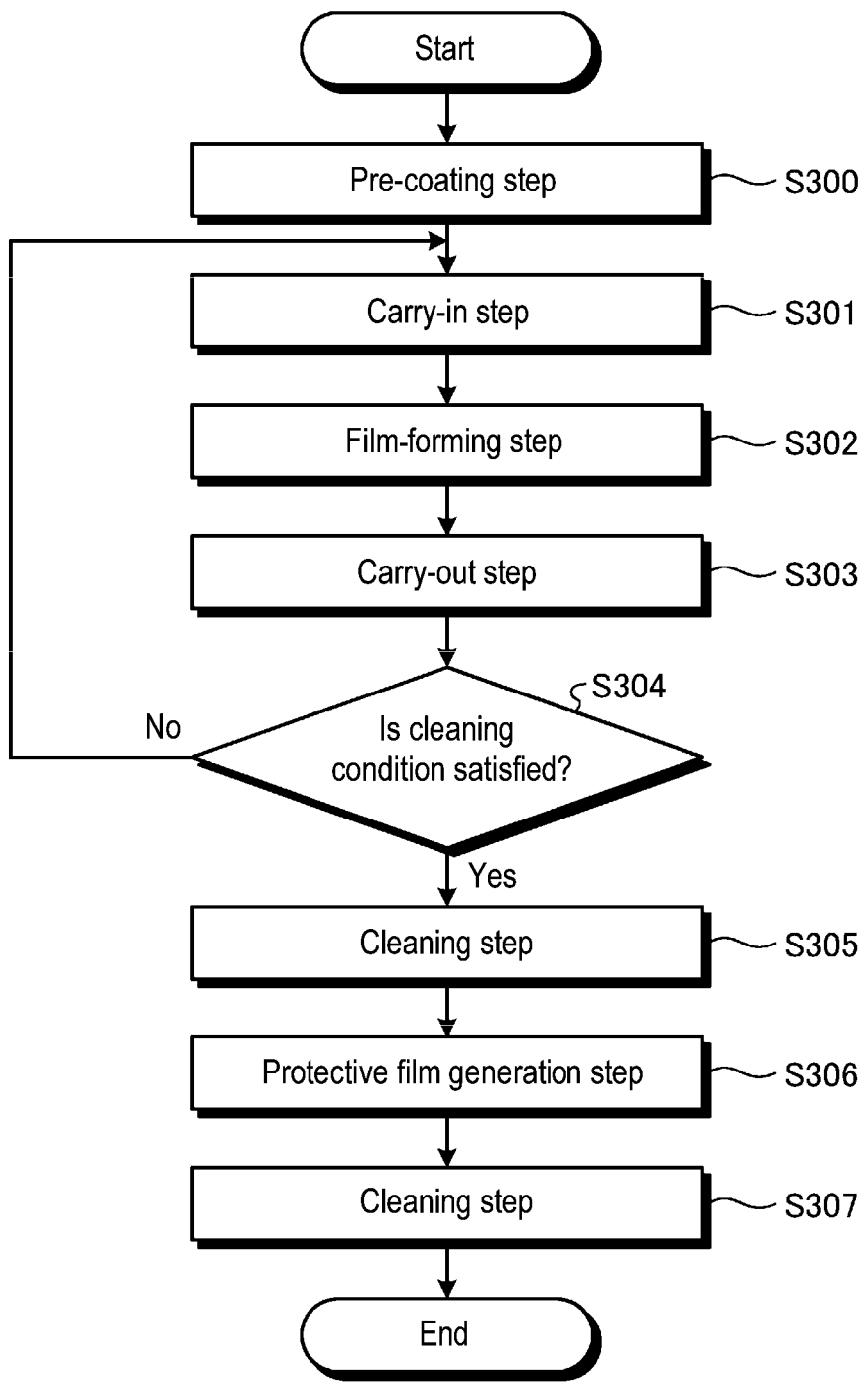
FIG. 7 is a flowchart illustrating an example of a film-forming process according to a modification.

In the plasma processing apparatus 100 according to the modification, when the number of wafers W where the film is formed in the film-forming step is large and the deposit film is thick, the cleaning step may be performed after the film-forming step is performed as illustrated in FIG. 7. FIG. 7 is a flowchart illustrating an example of a film-forming process according to a modification.

The plasma processing apparatus 100 according to the modification forms the film on the wafer W, like the plasma processing apparatus 100 according to the embodiment (S300 to S303). When the cleaning condition is not satisfied (S304: "No"), the plasma processing apparatus 100 according to the modification carries a new wafer W into the processing container 101 and performs the film formation on the new wafer W (S301 to S303). When the cleaning condition is satisfied (S304: "Yes"), the plasma processing apparatus 100 according to the modification performs the cleaning step (S305).

The cleaning condition is satisfied, for example, when the film-forming step is performed on, for example, a set plural number of wafers W. After performing the cleaning step, the plasma processing apparatus 100 according to the modification performs the protective film generation step (S306), and then performs the cleaning step again (S307). For example, the plasma processing apparatus 100 according to the modification forms the protective film after performing the cleaning step for a preset time, and then performs the cleaning step again.

This makes it possible for the plasma processing apparatus 100 according to the modification to execute the cleaning step depending on the thickness of the deposit film.

In the cleaning method of the plasma processing apparatus 100 according to the modification, the protective film may be formed based on the integrated processing time of the plasma processing on the wafer W (an example of the substrate) in the protective film generation step. The integrated processing time is the integrated processing time of the plasma processing from a state in which no deposit film is attached to the processing container 101. For example, the integrated processing time is the integrated processing time of the plasma processing on the wafer W after the cleaning step is performed. For example, as the integrated processing time of the plasma processing becomes longer, the time required to form the protective film in the protective film generation step becomes longer. That is, for example, as the integrated processing time of the plasma processing in the film-forming step becomes longer, the formed protective film becomes thicker.

This makes it possible for the plasma processing apparatus 100 according to the modification to adjust the thickness of the protective film depending on the thickness of the deposit film attached to the processing container 101 in the film-forming step. Therefore, the plasma processing apparatus 100 according to the modification is capable of improving uniformity in cleaning the processing container 101 in the plasma generation region 200 and the diffusion region 201.

Figure 8:
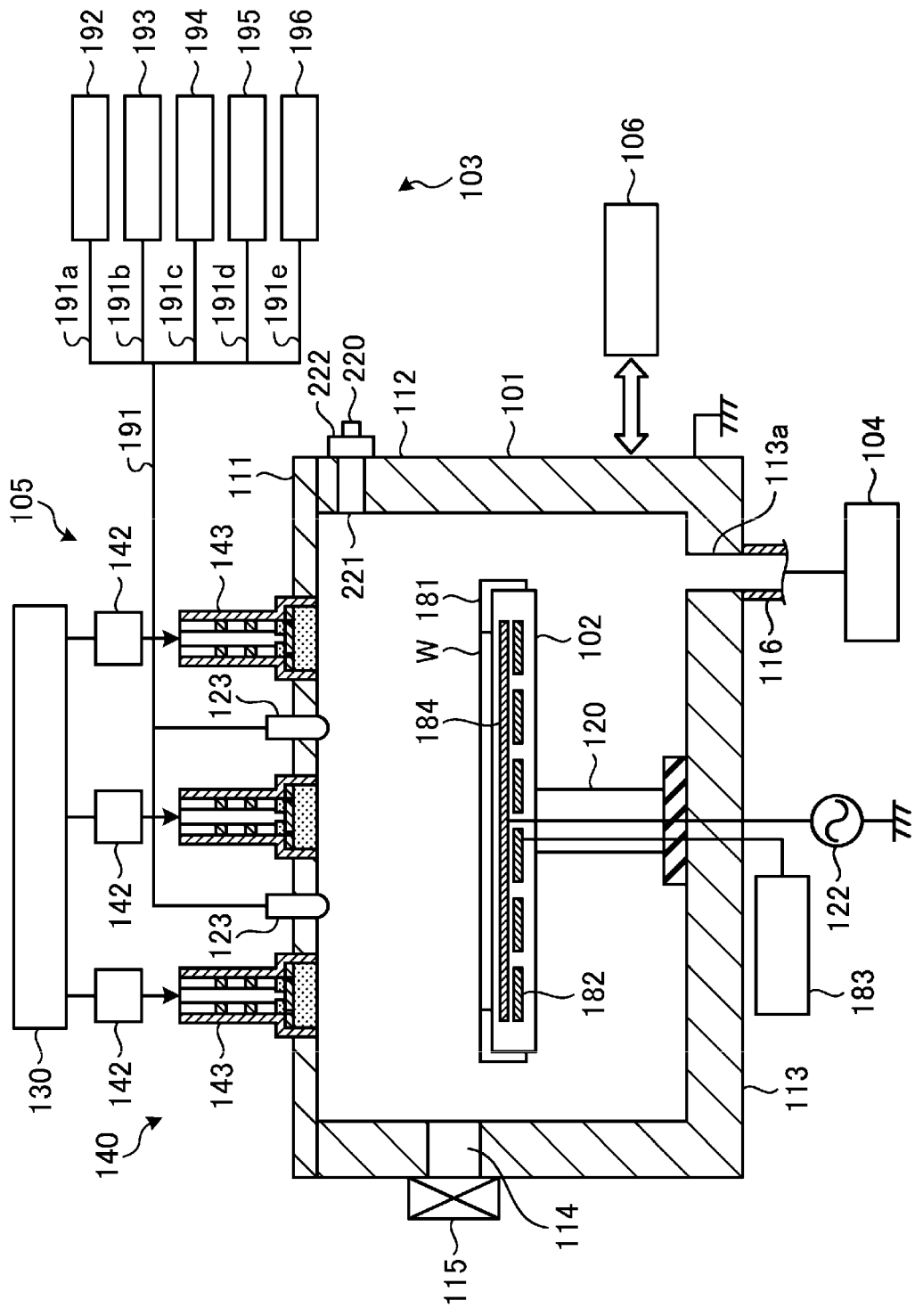
FIG. 8 is a view illustrating a schematic configuration of a plasma processing apparatus according to a modification.

In the cleaning method of the plasma processing apparatus 100 according to the modification, the protective film is formed based on an emission amount of plasma in the cleaning step. For example, the plasma processing apparatus 100 according to the modification includes a light receiver 220 as illustrated in FIG. 8. FIG. 8 is a view illustrating a schematic configuration of a plasma processing apparatus 100 according to a modification. The plasma processing apparatus 100 according to the modification is provided with an observation opening 221 in the processing container 101. An observation window 222 is hermetically installed to the opening 221. The light receiver 220 is provided outside the observation window 222. The light receiver 220 detects the emission amount of plasma. For example, when the deposit film attached to the processing container 101 is thick, the emission amount of plasma detected by the light receiver 220 becomes smaller. That is, as the emission amount of plasma detected by the light receiver 220 becomes smaller, the formed protective film becomes thicker.

This makes it possible for the plasma processing apparatus 100 according to the modification to adjust the thickness of the protective film depending on the thickness of the deposit film attached to the processing container 101 in the film-forming step. Therefore, the plasma processing apparatus 100 according to the modification is capable of improving uniformity in cleaning the processing container 101 in the plasma generation region 200 and the diffusion region 201.

In the cleaning method of the plasma processing apparatus 100 according to the modification, the deposit film attached to the processing container 101 is measured after the film-forming step is performed, and the thickness of the protective film in the protective film generation step may be adjusted based on the measurement result. In the cleaning method of the plasma processing apparatus 100 according to the modification, the amount of particles attached to the wafer W may be measured, and the thickness of the protective film in the protective film generation step may be adjusted based on the measurement result.

In the cleaning method of the plasma processing apparatus 100 according to the modification, the protective film formed in the protective film generation step may be a film containing elements such as carbon (C), boron (B), and aluminum (Al). In addition, the protective film formed by the protective film-forming process may be a film containing a halogen-based element such as fluorine (F) or chlorine (Cl). By forming the protective film containing the above-mentioned elements, it is possible to change a removal amount of the protective film itself. Accordingly, the plasma processing apparatus 100 according to the modification is capable of controlling a cleaning rate by adjusting the removal amount of the protective film per unit time.

This makes it possible for the plasma processing apparatus 100 according to the modification to adjust the removal amount of the deposit film per unit time, and thus to adjust the cleaning rate of the plasma generation region 200 and the diffusion region 201 in the cleaning step. Therefore, the plasma processing apparatus 100 according to the modification is capable of improving uniformity in cleaning the processing container 101 in the plasma generation region 200 and the diffusion region 201.

The plasma processing apparatus 100 may be a processing apparatus using capacitively coupled plasma (CCP) or inductively coupled plasma (ICP). A protective film is formed on a protective region corresponding to the plasma generation region 200. That is, the protective film may be formed in the protective region in which over-cleaning occurs in the cleaning step.

It shall be understood that the embodiments disclosed herein are examples in all respects and are not restrictive. Indeed, the above-described embodiments may be implemented in various forms. The embodiments described above may be omitted, replaced, or modified in various forms without departing from the scope and spirit of the appended claims.

EXPLANATION OF REFERENCE NUMERALS

100: plasma processing apparatus, 101: processing container, 103: gas supply mechanism, 105: microwave introduction apparatus, 106: controller, 200: plasma generation region, 201: diffusion region

What is claimed is:

1. A cleaning method of a plasma processing apparatus that performs a plasma processing on a substrate, the cleaning method comprising:
    forming a pre-coating film in a processing container, in which a processing space including a plasma generation region and a diffusion region is formed, by generating plasma in the processing container while supplying a first film-forming gas into the processing container, in a state that the substrate is not carried into the processing container;
    carrying the substrate into the processing container;
    forming a film on the substrate by generating plasma in the processing container while supplying a second film-forming gas into the process container;
    carrying the substrate out from the processing container;
    forming a protective film selectively in the plasma generation region by generating plasma in the processing container while supplying a third film-forming gas into the processing container, in a state that the substrate is carried out from the processing container; and
    cleaning an interior of the processing container in which the pre-coating film and the protective film have been formed by generating plasma in the processing container while supplying a cleaning gas into the processing container.

2. The cleaning method of claim 1, wherein, in the forming the protective film, the protective film is formed after the plasma processing is performed on the substrate.

3. The method of claim 2, wherein the forming the protective film and the cleaning are performed repeatedly.

4. The cleaning method of claim 1, wherein, in the forming the protective film, the protective film is formed based on an integrated processing time of the plasma processing on the substrate.

5. The cleaning method of claim 4, wherein the third film-forming gas supplied in the forming the protective film is a gas of the same type as the second film-forming gas used in the plasma processing on the substrate, and
    wherein the second film-forming gas and the third film-forming gas include a Si-containing gas.

6. The method of claim 1, wherein the forming the protective film and the cleaning are performed repeatedly.

7. The cleaning method of claim 1, wherein, in the forming the protective film, the protective film is formed based on an integrated processing time of the plasma processing on the substrate.

8. The cleaning method of claim 1, wherein, in the forming the protective film, the protective film is formed based on an emission amount of the plasma in the cleaning.

9. The cleaning method of claim 1, wherein the third film-forming gas supplied in the forming the protective film is a gas of the same type as the second film-forming gas used in the plasma processing on the substrate, and
    wherein the second film-forming gas and the third film-forming gas include a Si-containing gas.

10. A plasma processing apparatus comprising:
    a processing container in which a processing space including a plasma generation region and a diffusion region is formed; and
    a controller configured to perform plasma processing on a substrate within the processing container,
    wherein the controller is configured to perform:
    forming a pre-coating film in the processing container by generating plasma in the processing container while supplying a first film-forming gas into the processing container, in a state that the substrate is not carried into the processing container;
    carrying the substrate into the processing container;
    forming a film on the substrate by generating plasma in the processing container while supplying a second film-forming gas into the process container;
    carrying the substrate out from the processing container;
    forming a protective film selectively in the plasma generation region by generating plasma in the processing container while supplying a third film-forming gas into the processing container, in a state that the substrate is carried out from the processing container; and
    cleaning an interior of the processing container in which the pre-coating film and the protective film have been formed by generating plasma in the processing container while supplying a cleaning gas into the processing container.

* * * * *